(12) United States Patent
Li et al.

(10) Patent No.: US 10,121,431 B2
(45) Date of Patent: Nov. 6, 2018

(54) SHIFT REGISTER, GATE DRIVING CIRCUIT, DISPLAY SCREEN AND METHOD FOR DRIVING THE DISPLAY SCREEN

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Yan Li, Beijing (CN); Jian Sun, Beijing (CN); Cheng Li, Beijing (CN); Seong Jun An, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 198 days.

(21) Appl. No.: 15/174,518

(22) Filed: Jun. 6, 2016

(65) Prior Publication Data

US 2017/0076680 A1 Mar. 16, 2017

(30) Foreign Application Priority Data

Sep. 15, 2015 (CN) .......................... 2015 1 0587563

(51) Int. Cl.
*G11C 19/00* (2006.01)
*G09G 3/36* (2006.01)
(Continued)

(52) U.S. Cl.
CPC ............. *G09G 3/3648* (2013.01); *G09G 3/20* (2013.01); *G09G 3/3677* (2013.01);
(Continued)

(58) Field of Classification Search
None
See application file for complete search history.

(56) References Cited

U.S. PATENT DOCUMENTS 8,223,112 B2 * 7/2012 Ohkawa .................... G09G 3/20
345/100
2015/0287751 A1 10/2015 Jin et al.
(Continued)

FOREIGN PATENT DOCUMENTS

CN 1677575 A 10/2005
CN 1750073 A 3/2006
(Continued)

OTHER PUBLICATIONS

The Third Chinese Office Action dated Aug. 18, 2017; Appln. No. 201510587563.X.
(Continued)

*Primary Examiner* — Tuan T Lam
(74) *Attorney, Agent, or Firm* — Ladas & Parry LLP

(57) ABSTRACT

A shift register, a gate driving circuit, a display screen and a method for driving the display screen are proposed. A first and/or a second node control unit are incorporated. The first node control unit controls a first node according to a first control signal to put a pulling-up unit in an OFF state; the second node control unit controls a second node according to a second control signal to put a pulling-down unit in an OFF state. During the period that the display screen is powered off, the level at the driving signal output terminal is prevented from being affected by the pulling-up unit through the first node control unit and by the pulling-down unit through the second node control unit, such that thin film transistors connected to a gate line corresponding to the shift register are all turned on and thus accumulated charges can be released rapidly.

12 Claims, 10 Drawing Sheets

(51) Int. Cl.
*G09G 3/20* (2006.01)
*G11C 19/28* (2006.01)

(52) U.S. Cl.
CPC .............. *G09G 2300/0408* (2013.01); *G09G 2300/0426* (2013.01); *G09G 2300/0809* (2013.01); *G09G 2310/0251* (2013.01); *G09G 2310/0267* (2013.01); *G09G 2310/0286* (2013.01); *G09G 2310/08* (2013.01); *G11C 19/28* (2013.01)

(56) References Cited

U.S. PATENT DOCUMENTS

| | | | |
|---|---|---|---|
| 2016/0071614 A1* | 3/2016 | Lee | G09G 5/006 345/214 |
| 2016/0307641 A1* | 10/2016 | Zheng | G09G 3/3677 |
| 2016/0322115 A1* | 11/2016 | Xu | G11C 19/28 |
| 2017/0032752 A1* | 2/2017 | Huang | G09G 3/3648 |
| 2017/0076683 A1* | 3/2017 | Lee | G11C 19/28 |
| 2017/0153742 A1* | 6/2017 | Pang | G06F 3/0416 |

FOREIGN PATENT DOCUMENTS

| | | |
|---|---|---|
| CN | 101604551 A | 12/2009 |
| CN | 102075839 A | 5/2011 |
| CN | 103943660 A | 7/2014 |
| CN | 203774309 U | 8/2014 |
| CN | 104751764 A | 7/2015 |
| CN | 104766586 A | 7/2015 |
| KR | 1020050104895 A | 11/2005 |
| WO | 2015/052999 A1 | 4/2015 |

OTHER PUBLICATIONS

The Second Chinese Office Action dated Jun. 16, 2017; Appln. No. 201510587563.X.

First Chinese Office Action dated Jan. 25, 2017; Appln. No. 201510587563.X.

* cited by examiner

SHIFT REGISTER, GATE DRIVING CIRCUIT, DISPLAY SCREEN AND METHOD FOR DRIVING THE DISPLAY SCREEN

TECHNICAL FIELD OF THE DISCLOSURE

The present disclosure relates to a technical field of display, and particularly to a shift register, a gate driving circuit, a display screen and a method for driving the display screen.

BACKGROUND

Generally, in a thin film transistor display, gates of respective thin film transistors TFTs in a pixel region are supplied gate driving signals by a gate driving circuit. The gate driving circuit can be integrated on an array substrate of a liquid crystal display through an array process, that is, gate driver on array GOA process, such that cost may be saved and a beautiful design with two symmetric sides may be achieved for the liquid crystal panel. Meanwhile, bonding area and fan-out wiring space for a gate driving integrated circuit may be omitted, such that a narrow frame design may be achieved.

With reference to FIG. 1, a GOA circuit in the prior art comprises a plurality of shift registers, each of the shift registers is configured to supply a gate scanning signal to a gate connected to an signal output terminal Output(n) of the shift register, supply a reset signal to an adjacent shift register prior thereto, and supply an input signal to an adjacent shift register next thereto.

FIG. 2a illustrates a schematic diagram of structure of a traditional shift register in the prior art. With reference to FIG. 2a, the shift register comprises an input unit 1, a reset unit 2, a driving control unit 3, a pulling-up unit 4 and a pulling-down unit 5. An input terminal of the input unit 1 is configured to receive an input signal Input, and an output terminal of the input unit 1 is connected to a first node A. An input terminal of the reset unit 2 is configured to receive a reset control signal Reset, and an output terminal of the reset unit 2 is connected to the first node A. A first terminal of the driving control unit 3 is connected to the first node A, and a second terminal of the driving control unit 3 is connected to a second node B. A first input terminal of the pulling-up unit 4 is connected to the first node A, a second input terminal of the pulling-up unit 4 is configured to receive a first clock signal CK, and an output terminal of the pulling-up unit 4 is connected to a driving signal output terminal Output of the shift register. A first input terminal of the pulling-down unit 5 is connected to the second node B, a second input terminal of the pulling-down unit 5 is connected to a reference signal terminal Vref, and an output terminal of the pulling-down unit 5 is connected to the driving signal output terminal Output of the shift register.

The input unit 1 is configured to set a level at the first node A to a high level (or a low level) under the control of the input signal Input, the reset unit 2 is configured to set the level at the first node A to a low level (or a high level) under the control of the reset control signal Reset, the driving control unit 3 is configured to set a level at the second node B to a low level (or a high level) when the first node A is at a high level (or a low level) and set the level at the first node A to a low level (or a high level) when the second node B is at a high level (or a low level), the pulling-up unit 4 is configured to supply the first clock signal CK to the driving signal output terminal Output when the first node A is at a high level (or a low level), the pulling-down unit 5 is configured to supply a signal at the reference signal terminal Vref to the driving signal output terminal Output when the second node B is at a high level (or a low level). In the above shift register, when an active pulse signal of the input signal is a high level signal (or a low level signal), the driving signal output terminal Output supplies a high level signal (or a low level signal) to a gate line corresponding thereto, and thin film transistors connected to the gate line are all turned on.

It is well-known that a liquid crystal display screen will be turned to black slowly after being powered off due to charge accumulation in the liquid crystal display screen, which has a negative effect on quality of the liquid crystal display screen. Therefore, in order to solve the above problem, in the prior art, a discharging control unit is commonly added in the shift register. As shown in FIG. 2b, a control terminal of the discharging control unit 6 is configured to receive a discharging control signal EN1, an input terminal of the discharging control unit 6 is connected to the reference signal terminal Vref, a first output terminal of the discharging control unit 6 is connected to the second node B, and a second output terminal of the discharging control unit 6 is connected to the driving signal output terminal Output. The discharging control unit 6 is configured to output a low level signal (or a high level signal) to the second node B and output a high level signal (or a low level signal) to the driving signal output terminal Output under the control of the discharging control signal EN1 during the period that the liquid crystal display screen is powered off, such that the shift register can pull up (or pull down) the level at the driving signal output terminal Output through the discharging control unit 6 during the period that the liquid crystal display screen is powered off, and thus the thin film transistors connected to the gate line corresponding to the shift register can be turned on, which enabling rapid releasing of the accumulated charges in the liquid crystal display screen.

However, in the above shift register, although the discharging control unit outputs a low level signal (or a high level signal) to the second node and outputs a high level signal (or a low level signal) to the driving signal output terminal during the period that the liquid crystal display screen is powered off, the pulling-up unit might be controlled by the first node to output the first clock signal to the driving signal output terminal and the pulling-down unit might be controlled by the second node to output the signal at the reference signal terminal to the driving signal output terminal since the pulling-up unit and the pulling-down unit are generally constituted by thin film transistors through which leakage currents may flow, such that the level at the driving signal output terminal cannot be fully pulled up (or pulled down), and thus charges accumulated in the liquid crystal display screen cannot be released rapidly.

SUMMARY

In embodiments of the present disclosure, a shift register, a gate driving circuit, a display screen and a method for driving the display screen are proposed to fully pull up (or pull down) the level at the driving signal output terminal of the shift register during the period that the display screen is powered off, such that charges accumulated in the display screen can be released rapidly and thus quality of the display screen can be improved.

According to one aspect of the present disclosure, there is provided a shift register comprising an input unit, a reset unit, a driving control unit, a pulling-up unit, a pulling-down unit and a discharging control unit. An output terminal of the input unit, an output terminal of the reset unit, a first terminal of the driving control unit and a control terminal of the pulling-up unit are connected to a first node, and a second terminal of the driving control unit, a control terminal of the pulling-down unit and a first output terminal of the discharging control unit are connected to a second node. An output terminal of the pulling-up unit, an output terminal of the pulling-down unit and a second output terminal of the discharging control unit are connected to a driving signal output terminal of the shift register.

According to one embodiment of the present disclosure, the shift register further comprises a first node control unit and/or a second node control unit. An input terminal of the first node control unit is configured to receive a first control signal, and an output terminal of the first node control unit is connected to the first node of the shift register. The first node control unit is configured to control a level at the first node according to the first control signal so as to put the pulling-up unit in an OFF state. An input terminal of the second node control unit is configured to receive a second control signal, and an output terminal of the second node control unit is connected to the second node of the shift register. The second node control unit is configured to control a level at the second node according to the second control signal so as to put the pulling-down unit in an OFF state.

According to one embodiment of the present disclosure, the first node control unit comprises a first capacitor. A first electrode of the first capacitor is connected to the first node and a second electrode of the first capacitor is configured to receive the first control signal.

According to one embodiment of the present disclosure, the second node control unit comprises a second capacitor. A first electrode of the second capacitor is connected to the second node and a second electrode of the second capacitor is configured to receive the second control signal.

According to one embodiment of the present disclosure, when the shift register comprises the first node control unit and the second node control unit, the first control signal and the second control signal are a same control signal.

According to one embodiment of the present disclosure, the second electrode of the first capacitor and the second electrode of the second capacitor are arranged in a same layer, and/or the first electrode of the first capacitor and the first electrode of the second capacitor are arranged in a same layer.

According to one embodiment of the present disclosure, the first capacitor and the second capacitor have a same capacitance value.

According to another aspect of the present disclosure, there is provided a gate driving circuit comprising a plurality of cascaded shift registers according to the above embodiments of the present disclosure.

According to one embodiment of the present disclosure, in the gate driving circuit, one shift register corresponds to a first node control unit, and/or one shift register corresponds to a second node control unit.

According to one embodiment of the present disclosure, in the gate driving circuit, at least two shift registers correspond to a first node control unit, and/or at least two shift registers correspond to a second node control unit.

According to another aspect of the present disclosure, there is provided a display screen comprising the gate driving circuit according to the above embodiments of the present disclosure.

According to another aspect of the present disclosure, there is provided a method for driving the display screen. During the period that the display screen is powered off, each of the first node control units controls the level at the first node in the shift register corresponding thereto according to the first control signal so as to put the pulling-up unit in the shift register corresponding thereto in an OFF state; and/or each of the second node control units controls the level at the second node in the shift register corresponding thereto according to the second control signal so as to put the pulling-down unit in the shift register corresponding thereto in an OFF state.

In the shift register, the driving control circuit, the display screen and the method for driving the display screen according to the embodiments of the present disclosure, the first node control unit and/or the second node control unit are further incorporated on the basis of the shift register in the prior art which comprises the input unit, the reset unit, the driving control unit, the pulling-up unit, the pulling-down unit and the discharging control unit, where an input terminal of the first node control unit is configured to receive a first control signal, and an output terminal of the first node control unit is connected to the first node of the shift register, the first node control unit is configured to control a level at the first node according to the first control signal so as to put the pulling-up unit in an OFF state; an input terminal of the second node control unit is configured to receive a second control signal, and an output terminal of the second node control unit is connected to the second node of the shift register, the second node control unit is configured to control a level at the second node according to the second control signal so as to put the pulling-down unit in an OFF state. As a result, during the period that the display screen is powered off, the level at the driving signal output terminal is prevented from being affected by the pulling-up unit through the first node control unit and from being affected by the pulling-down unit through the second node control unit, such that it can be ensured that the thin film transistors connected to the gate line corresponding to the shift register are all turned on and thus the charges accumulated in the display screen can be released rapidly.

BRIEF DESCRIPTION OF THE DRAWINGS

In order to explain the technical solutions in the embodiments of the present disclosure or in the prior art more clearly, accompanying drawings required for describing the embodiments of the present disclosure or the prior art will be introduced. Obviously, the accompanying drawings below are only some embodiments of the present disclosure, and based on the accompanying drawings, other accompanying drawings can be obtained by those skilled in the art without paying inventive labor.

FIG. 7a is a schematic diagram of timing sequences of signals of the shift register shown in FIG. 6a.

DETAILED DESCRIPTION

Descriptions will be made clearly and thoroughly for a shift register, a gate driving circuit, a display screen and a method for driving the display screen according to the embodiments of the present disclosure below, taken in conjunction with the accompanying drawings of the embodiments of the present disclosure. Obviously, the described embodiments are only some but not all of the embodiments of the present disclosure. Other embodiments obtained by those skilled in the art based on the described embodiments without paying inventive labor shall belong to the scope sought for protection in the present disclosure.

Figure 1:
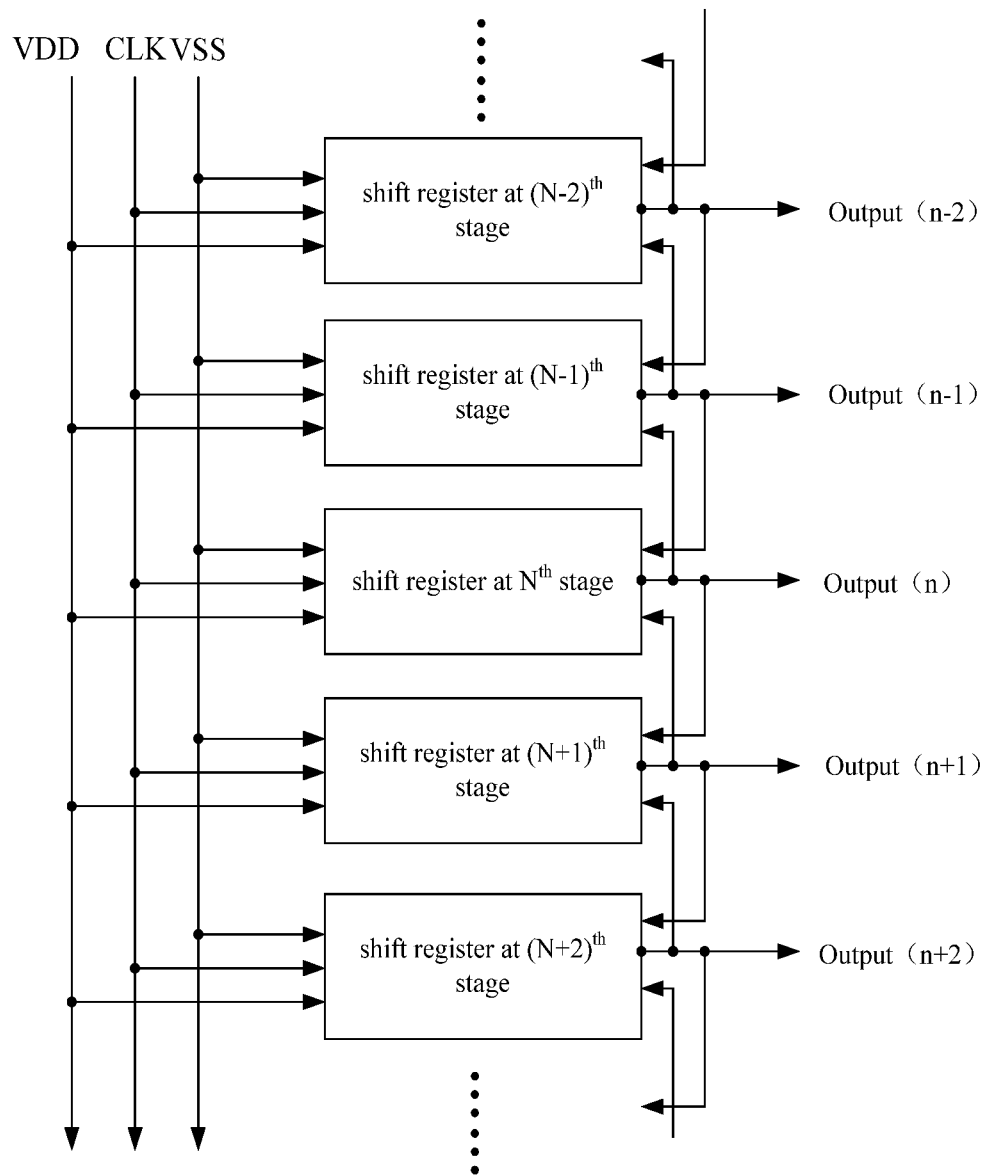
FIG. 1 is a schematic diagram illustrating structure of a GOA circuit in the prior art.
Figure 2A:
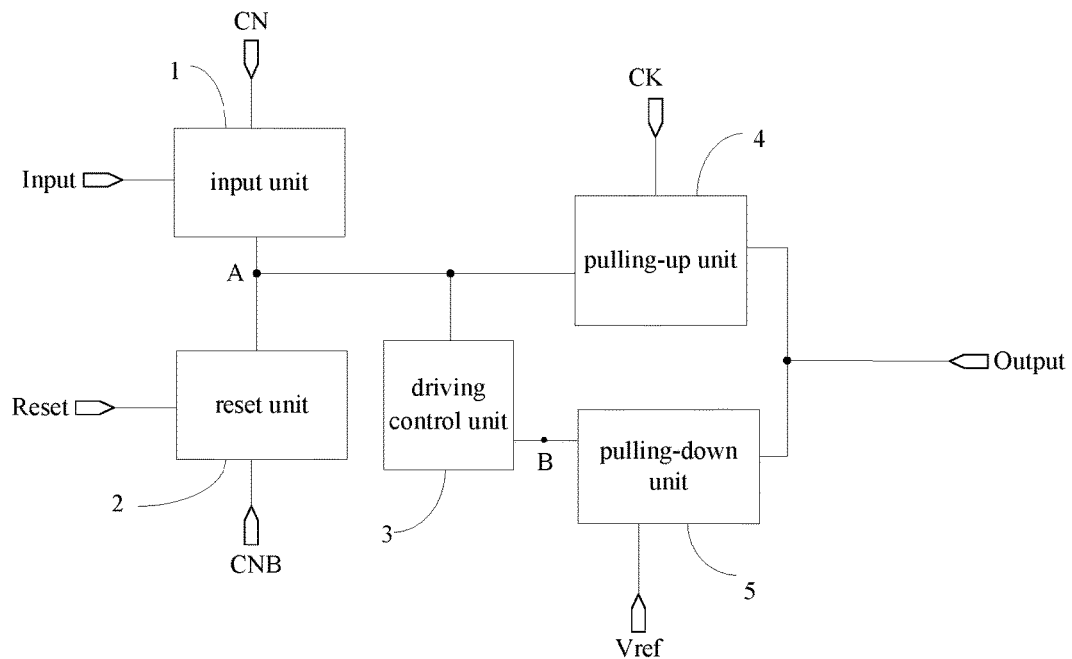
FIG. 2a is a schematic diagram illustrating structure of a shift register in the prior art.
Figure 2B:
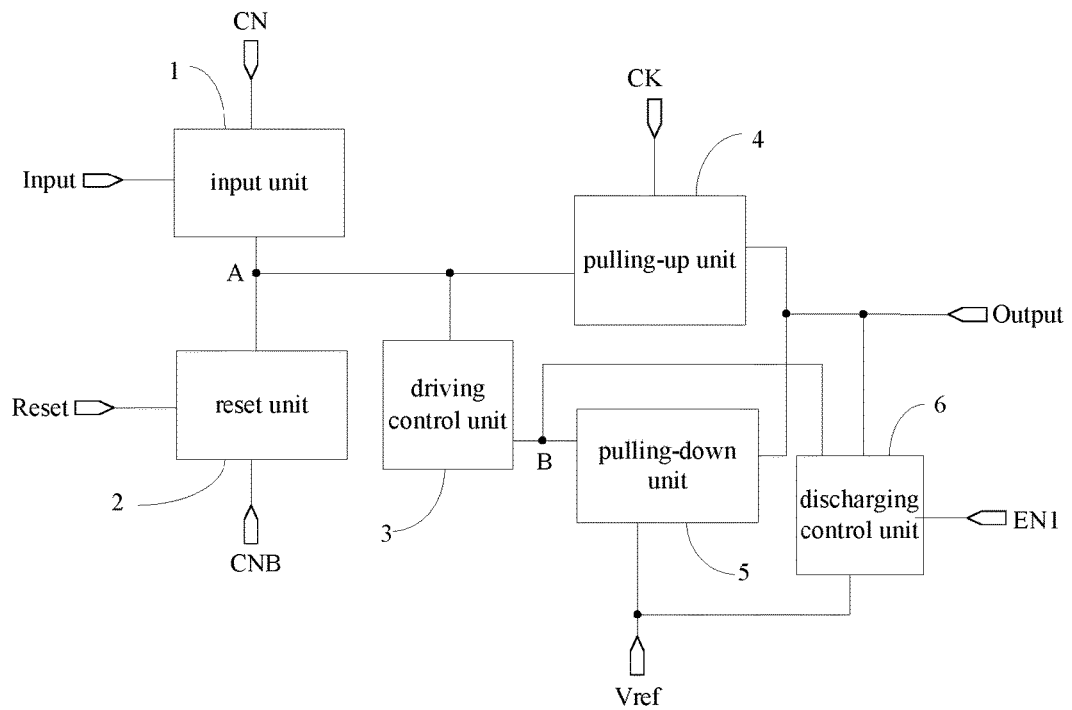
FIG. 2b is another schematic diagram illustrating structure of a shift register in the prior art.
Figure 3A:
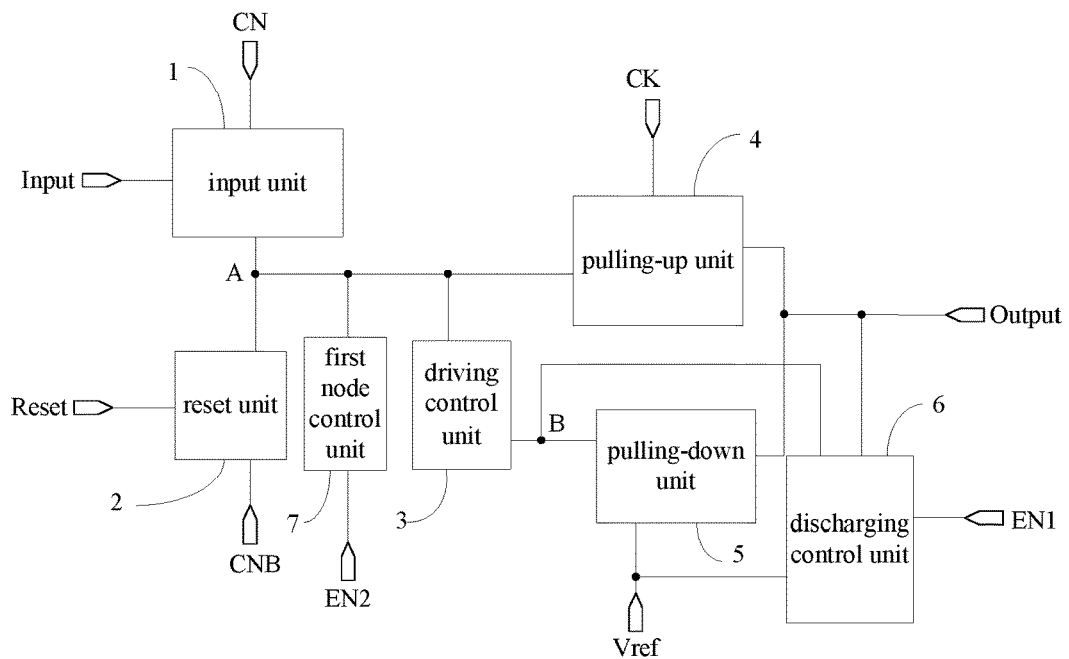
FIG. 3a to FIG. 3c are schematic diagrams illustrating structures of shift registers according to the embodiments of the present disclosure.
Figure 3B:
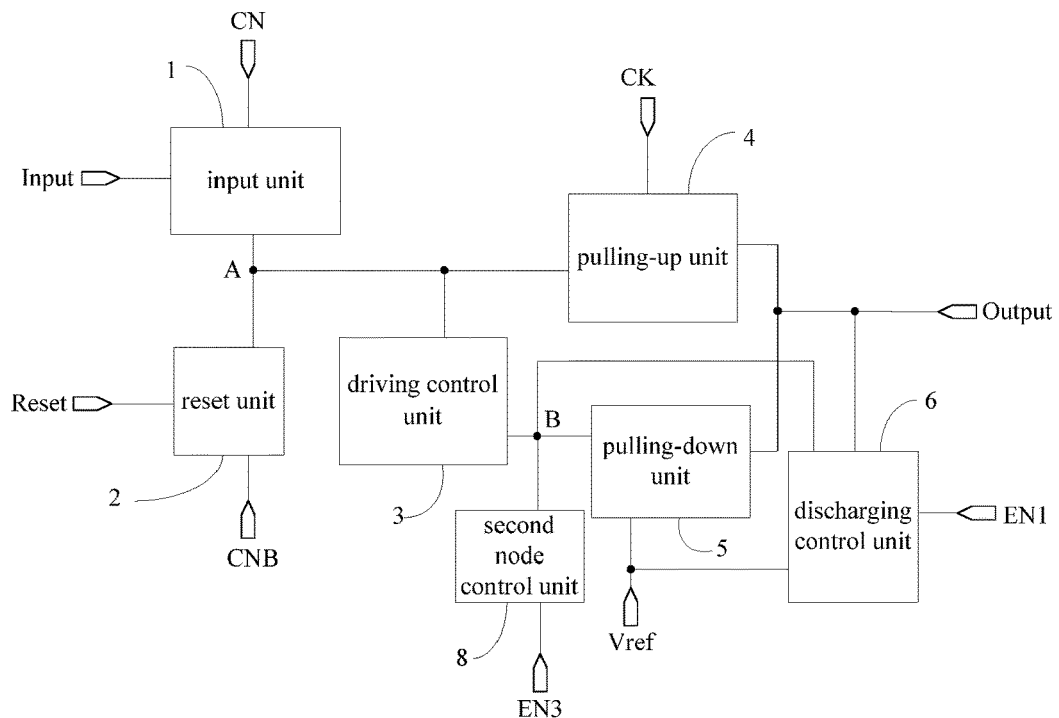
Figure 3C:
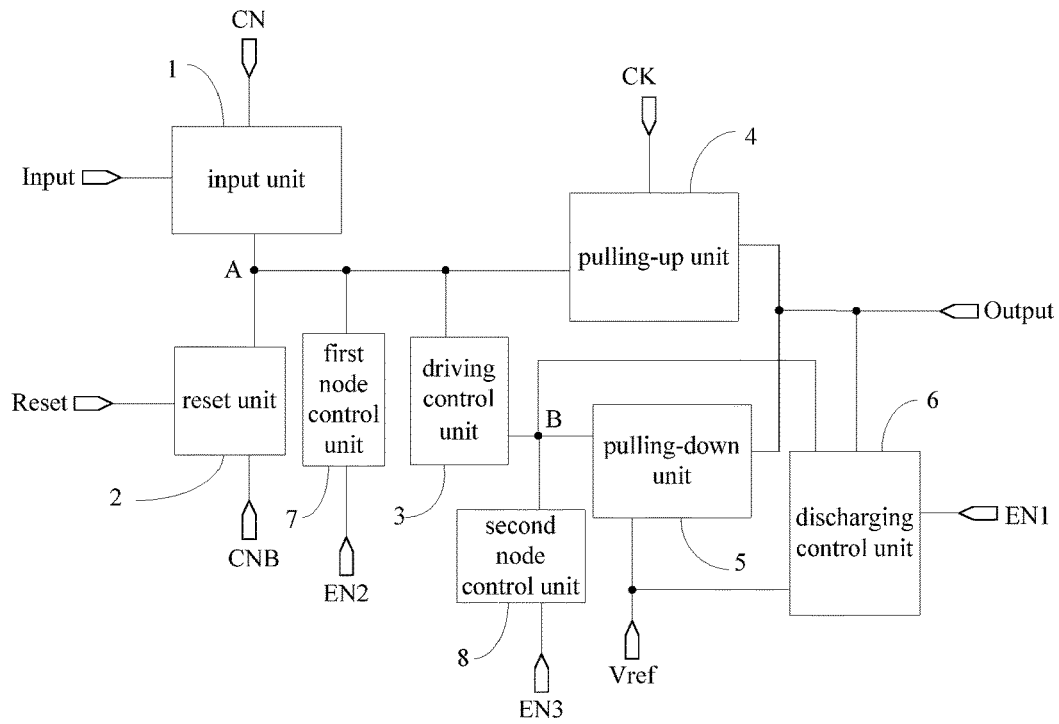

FIG. 3a to FIG. 3C illustrate shift registers according to the embodiments of the present disclosure. The shift register comprises an input unit 1, a reset unit 2, a driving control unit 3, a pulling-up unit 4, a pulling-down unit 5 and a discharging control unit 5. An output terminal of the input unit 1, an output terminal of the reset unit 2, a first terminal of the driving control unit 3 and a control terminal of the pulling-up unit 4 are connected to a first node A, and a second terminal of the driving control unit 3, a control terminal of the pulling-down unit 5 and a first output terminal of the discharging control unit 6 are connected to a second node B. An output terminal of the pulling-up unit 4, an output terminal of the pulling-down unit 5 and a second output terminal of the discharging control unit 6 are connected to a driving signal output terminal Output of the shift register.

With reference to FIG. 3a, the shift register further comprises a first node control unit 7. An input terminal of the first node control unit 7 is configured to receive a first control signal EN2, and an output terminal of the first node control unit 7 is connected to the first node A of the shift register. The first node control unit 7 is configured to control a level at the first node A according to the first control signal EN2 so as to put the pulling-up unit 4 in an OFF state. As such, when the shift register is applied to a display screen, during the period that the display screen is powered off, the first node control unit 7 controls the level at the first node A according to the first control signal EN2 so as to make the pulling-up unit 4 in an OFF state, such that the level at the driving signal output terminal Output can be prevented from being affected by the pulling-up unit 4, and it can be ensured that the thin film transistors connected to the gate line corresponding to the shift register are all turned on and thus the charges accumulated in the display screen can be released rapidly.

Alternatively, with reference to FIG. 3b, the shift register further comprises a second node control unit 8. An input terminal of the second node control unit 8 is configured to receive a second control signal EN3, and an output terminal of the second node control unit 8 is connected to the second node B of the shift register. The second node control unit 8 is configured to control a level at the second node B according to the second control signal EN3 so as to put the pulling-down unit 5 in an OFF state. As such, when the shift register is applied to a display screen, during the period that the display screen is powered off, the second node control unit 8 controls the level at the second node B according to the second control signal EN3 so as to make the pulling-down unit 5 in an OFF state, such that the level at the driving signal output terminal Output can be prevented from being affected by the pulling-down unit 5, and it can be ensured that the thin film transistors connected to the gate line corresponding to the shift register are all turned on and thus the charges accumulated in the display screen can be released rapidly.

According to another embodiment of the present disclosure, with reference to FIG. 3c, the shift register further comprises the first node control unit 7 and the second node control unit 8. As such, when the shift register is applied to a display screen, during the period that the display screen is powered off, the first node control unit 7 controls the level at the first node A according to the first control signal EN2 so as to make the pulling-up unit 4 in an OFF state, such that the level at the driving signal output terminal Output can be prevented from being affected by the pulling-up unit 4; meanwhile the second node control unit 8 controls the level at the second node B according to the second control signal EN3 so as to make the pulling-down unit 5 in an OFF state, such that the level at the driving signal output terminal Output can be prevented from being affected by the pulling-down unit 5. Finally, the level at the driving signal output terminal Output can be prevented from being affected by the pulling-up unit 4 and the pulling-down unit 5 during the period that the display screen is powered off, and it can be ensured that the thin film transistors connected to the gate line corresponding to the shift register are all turned on and thus the charges accumulated in the display screen can be released rapidly.

In the shift register according to the embodiments of the present disclosure, the first node control unit and/or the second node control unit are further incorporated on the basis of the shift register in the prior art which comprises the input unit, the reset unit, the driving control unit, the pulling-up unit, the pulling-down unit and the discharging control unit, where an input terminal of the first node control unit is configured to receive a first control signal, and an output terminal of the first node control unit is connected to the first node of the shift register, the first node control unit is configured to control a level at the first node according to the first control signal so as to put the pulling-up unit in an OFF state; an input terminal of the second node control unit is configured to receive a second control signal, and an output terminal of the second node control unit is connected to the second node of the shift register, the second node control unit is configured to control a level at the second node according to the second control signal so as to put the pulling-down unit in an OFF state. As a result, during the period that the display screen is powered off, the level at the driving signal output terminal is prevented from being affected by the pulling-up unit through the first node control unit and from being affected by the pulling-down unit through the second node control unit, such that it can be ensured that the thin film transistors connected to the gate line corresponding to the shift register are all turned on and thus the charges accumulated in the display screen can be released rapidly.

Specifically, in the shift registers according to the embodiments of the present disclosure, as shown in FIG. 3a to FIG. 3c, an input terminal of the input unit 1 is configured to receive an input signal Input, and the output terminal of the input unit 1 is connected to the first node A; an input terminal of the reset unit 2 is configured to receive a reset control signal Reset, and the output terminal of the reset unit 2 is connected to the first node A; the first terminal of the driving control unit 3 is connected to the first node A, and the second terminal of the driving control unit 3 is connected to the second node B; the first input terminal of the pulling-up unit 4 is connected to the first node A, a second input terminal of the pulling-up unit 4 is configured to receive a first clock signal CK, and the output terminal of the pulling-up unit 4 is connected to the driving signal output terminal Output of the shift register; the first input terminal of the pulling-down unit 5 is connected to the second node B, a second input terminal of the pulling-down unit 5 is connected to a reference signal terminal Vref, and the output terminal of the pulling-down unit 5 is connected to the driving signal output terminal Output of the shift register; a control terminal of the discharging control unit 6 is configured to receive a discharging control signal EN1, an input terminal of the discharging control unit 6 is connected to the reference signal terminal Vref, the first output terminal of the discharging control unit 6 is connected to the second node B, and the second output terminal of the discharging control unit 6 is connected to the driving signal output terminal Output.

When an active pulse signal of the input signal Input is a high level signal, the input unit 1 is configured to set a level at the first node A to a high level under the control of the input signal Input, the reset unit 2 is configured to set the level at the first node A to a low level under the control of the reset control signal Reset, the driving control unit 3 is configured to set a level at the second node B to a low level when the first node A is at a high level and set the level at the first node A to a low level when the second node B is at a high level, the pulling-up unit 4 is configured to supply the first clock signal CK to the driving signal output terminal Output when the first node A is at a high level, the pulling-down unit 5 is configured to supply a signal at the reference signal terminal Vref to the driving signal output terminal Output when the second node B is at a high level, the discharging control unit 6 is configured to output a low level signal to the second node B and output a high level signal to the driving signal output terminal Output under the control of the discharging control signal EN1 during the period that the display screen is powered off, where the reference signal terminal Vref is at a low level.

When an active pulse signal of the input signal Input is a low level signal, the input unit 1 is configured to set a level at the first node A to a low level under the control of the input signal Input, the reset unit 2 is configured to set the level at the first node A to a high level under the control of the reset control signal Reset, the driving control unit 3 is configured to set a level at the second node B to a high level when the first node A is at a low level and set the level at the first node A to a high level when the second node B is at a low level, the pulling-up unit 4 is configured to supply the first clock signal CK to the driving signal output terminal Output when the first node A is at a low level, the pulling-down unit 5 is configured to supply a signal at the reference signal terminal Vref to the driving signal output terminal Output when the second node B is at a low level, the discharging control unit 6 is configured to output a high level signal to the second node B and output a low level signal to the driving signal output terminal Output under the control of the discharging control signal EN1 during the period that the display screen is powered off, where the reference signal terminal Vref is at a high level.

Detailed description will be given to the present disclosure in combination with the specific embodiments of the present disclosure. It should be explained that the embodiments of the present disclosure are merely for better explanation of the present disclosure rather than limitation of the present disclosure.

Figure 4:
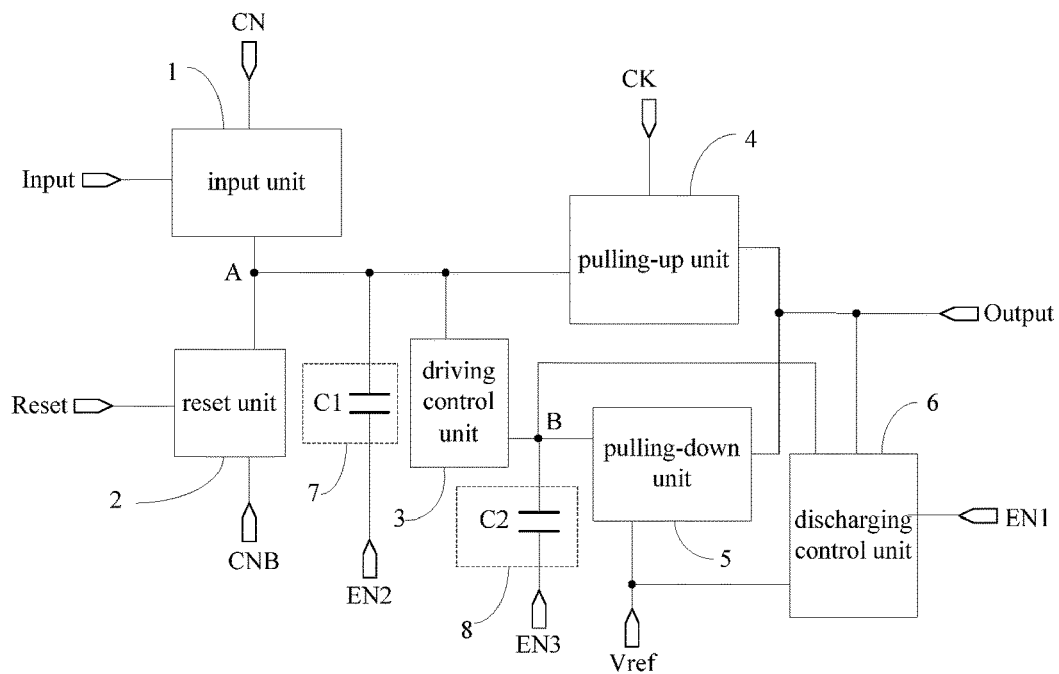
FIG. 4 is a schematic diagram illustrating specific structure of a first node control unit and a second node control unit according to the embodiments of the present disclosure.

In the shift register according to one embodiment of the present disclosure, with reference to FIG. 4, the first node control unit 7 comprises a first capacitor C1. A first electrode of the first capacitor C1 is connected to the first node A and a second electrode of the first capacitor C1 is configured to receive the first control signal EN2.

Specifically, in the shift register according to one embodiment of the present disclosure, when the first node control unit 7 is utilized to control the level at the first node A so as to put the pulling-up unit 4 in an OFF state, during the period that the display screen is powered off, the first control signal EN2 should be a low level signal if the pulling-up unit 4 is in an OFF state when the first node A is at a low level, but should be a high level signal if the pulling-up unit 4 is in an OFF state when the first node A is at a high level.

An exemplary specific structure of the first node control unit 7 in the shift register is illustrated above, but the first node control unit 7 is not limited to the above exemplary specific structure and can be other structures known to those skilled in the art when being implemented specifically, no limitation on the structure of the first node control unit 7 is made herein.

In the shift register according to one embodiment of the present disclosure, with reference to FIG. 4, the second node control unit 8 comprises a second capacitor C2. A first electrode of the second capacitor C2 is connected to the second node B and a second electrode of the second capacitor C2 is configured to receive the second control signal EN3.

Specifically, in the shift register according to one embodiment of the present disclosure, when the second node control unit 8 is utilized to control the level at the second node B so as to put the pulling-down unit 5 in an OFF state, during the period that the display screen is powered off, the second control signal EN3 should be a low level signal if the pulling-down unit 5 is in an OFF state when the second node B is at a low level, but should be a high level signal if the pulling-down unit 5 is in an OFF state when the second node B is at a high level.

An exemplary specific structure of the second node control unit 8 in the shift register is illustrated above, but the second node control unit 8 is not limited to the above exemplary specific structure and can be other structures known to those skilled in the art when being implemented specifically, no limitation on the structure of the second node control unit 8 is made herein.

Figure 6A:
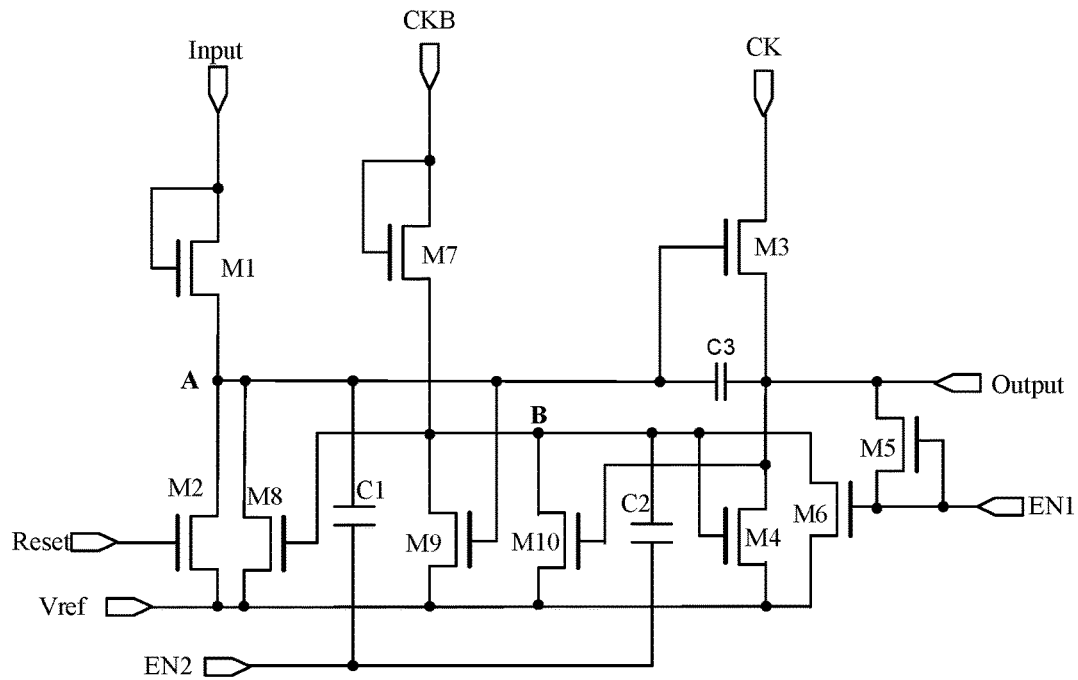
FIG. 6a is another schematic diagram illustrating structure of a shift register constituted by N type switching transistors according to the embodiments of the present disclosure.
Figure 6B:
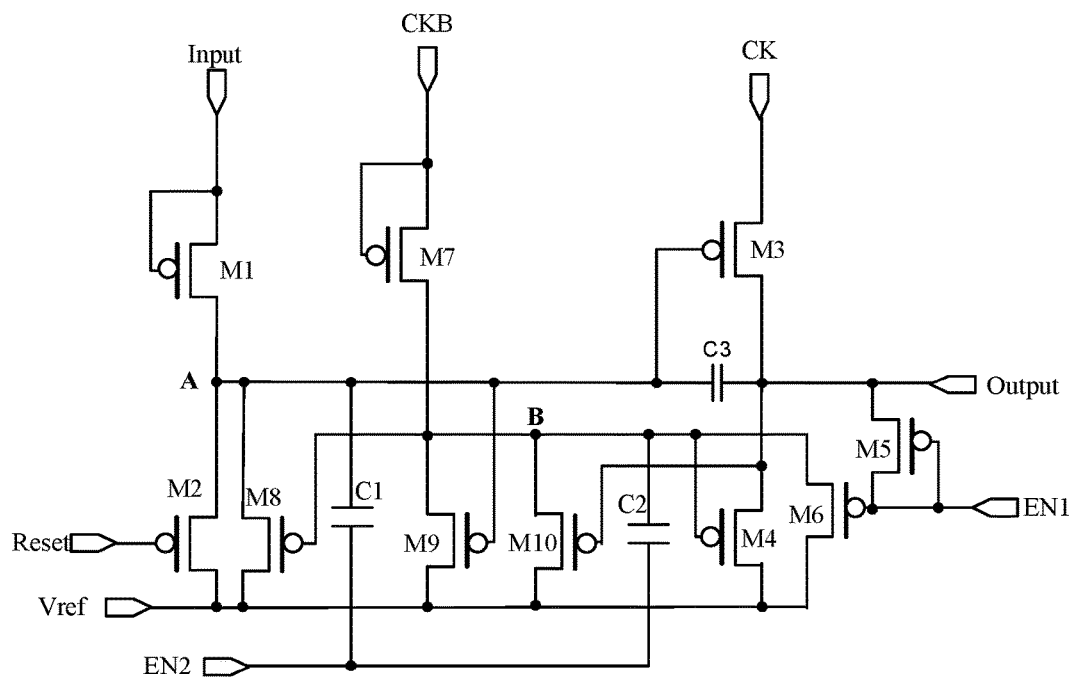
FIG. 6b is another schematic diagram illustrating structure of a shift register constituted by P type switching transistors according to the embodiments of the present disclosure.

In the shift register according to one embodiment of the present disclosure, with reference to FIG. 6a and FIG. 6b, the shift register comprises the first node control unit 7 and the second node control unit 8, the first control signal EN2 and the second control signal EN3 are a same control signal, and thus the shift register can be supplied the first control signal EN2 and the second control signal EN3 from a same signal terminal.

Figure 8:
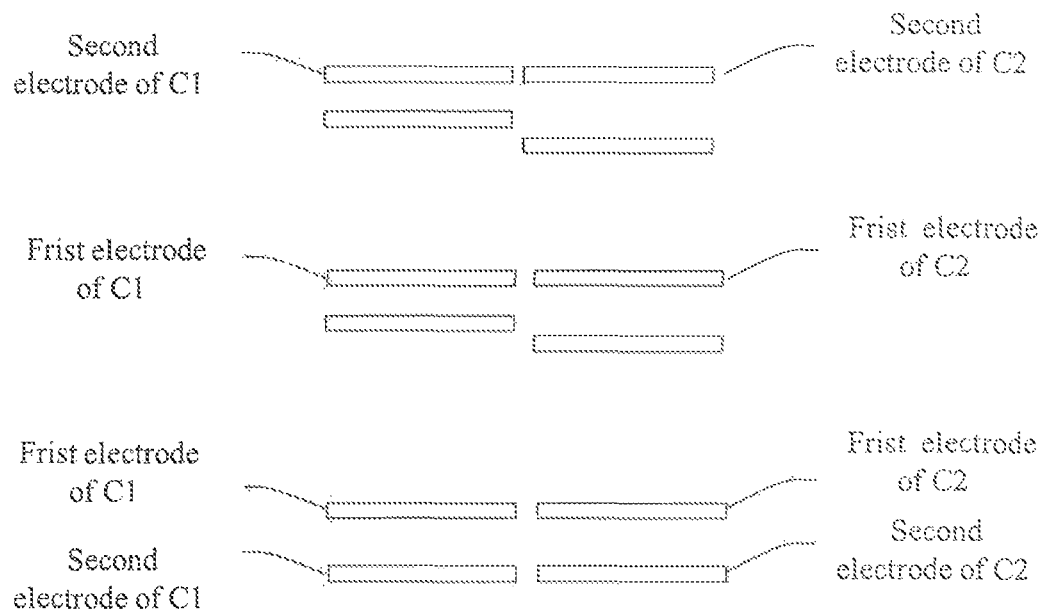
FIG. 8 is a schematic diagram of the arrangements of the first capacitor and the second capacitor.

According to one embodiment of the present disclosure, in order to simplify the manufacturing process, in the shift register, the second electrode of the first capacitor and the second electrode of the second capacitor are arranged in a same layer, and/or the first electrode of the first capacitor and the first electrode of the second capacitor are arranged in a same layer as shown in FIG. 8.

Furthermore, according to one embodiment of the present disclosure, the first capacitor and the second capacitor in the shift register can be arranged in a same layer with other capacitors in the shift register.

According to one embodiment of the present disclosure, the first capacitor and the second capacitor in the shift register have a same capacitance value.

Figure 5A:
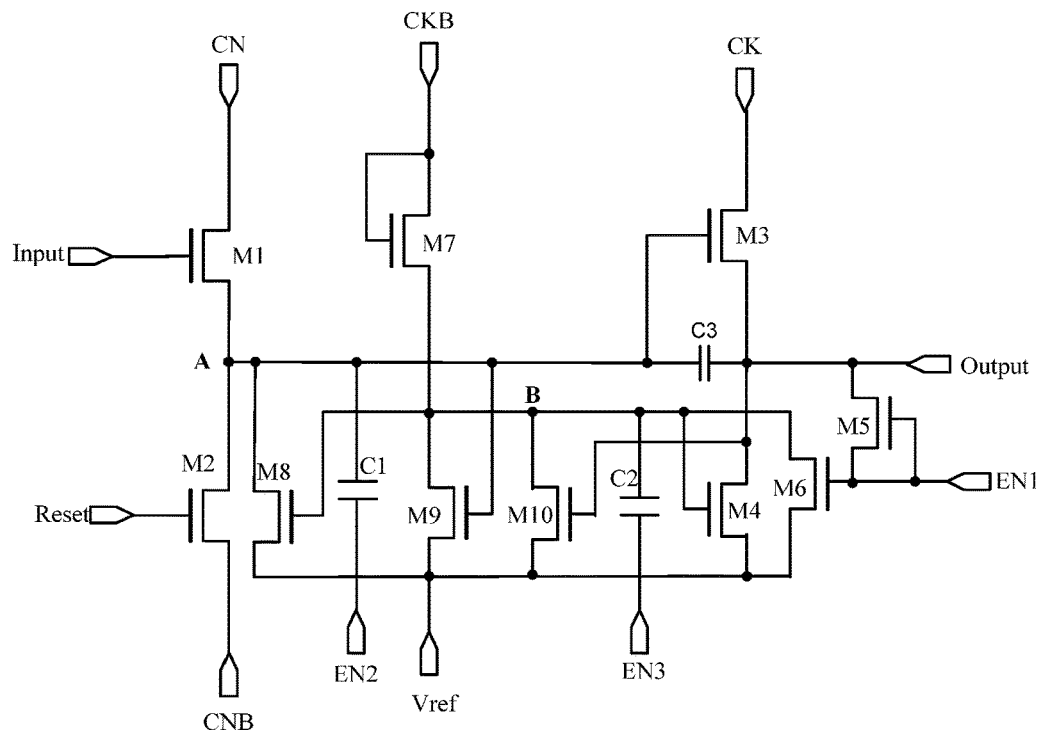
FIG. 5a is a schematic diagram illustrating structure of a shift register constituted by N type switching transistors according to the embodiments of the present disclosure.
Figure 5B:
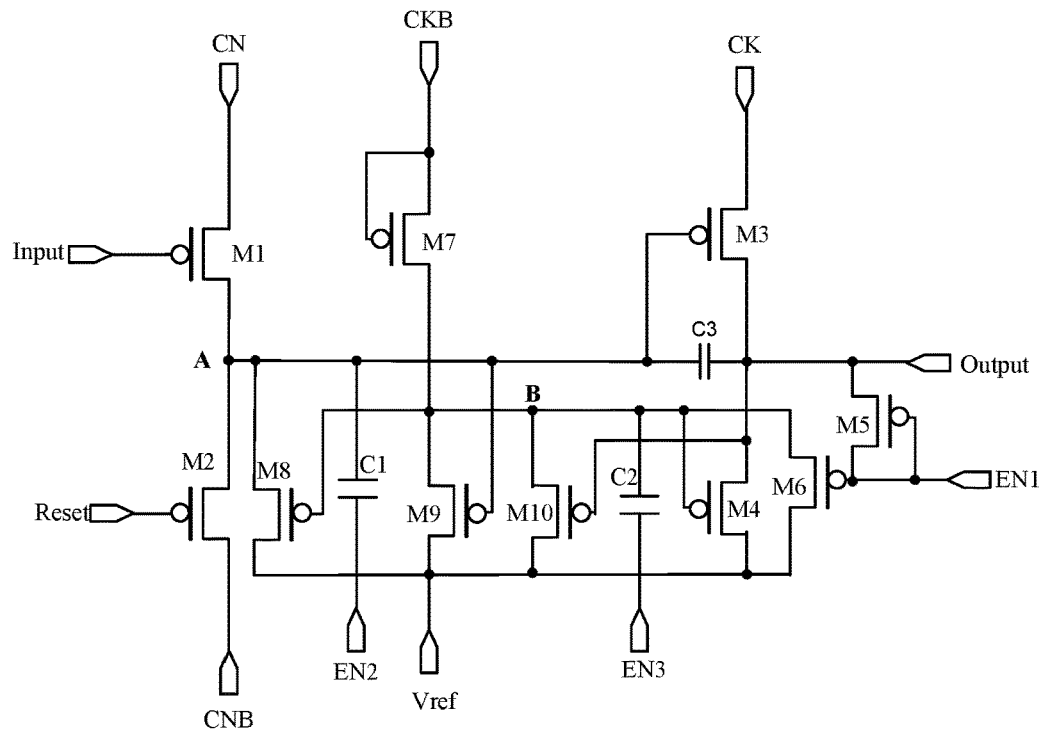
FIG. 5b is a schematic diagram illustrating structure of a shift register constituted by P type switching transistors according to the embodiments of the present disclosure.

Specifically, in the shift register according to the embodiments of the present disclosure, as shown in FIG. 5a and FIG. 5b, the input unit 1 comprises a first switching transistor M1. A gate of the first switching transistor M1 is configured to receive the input signal Input, a source of the first switching transistor M1 is configured to receive a first reference signal CN, and a drain of the first switching transistor M1 is connected to the first node A.

Specifically, the first switching transistor M1 can be an N type transistor as shown in FIG. 5a, or can be a P type transistor as shown in FIG. 5b. No limitation is made herein to the type of the first switching transistor M1.

In a specific implementation, as shown in FIG. 6a and FIG. 6b, the first reference signal CN and the input signal Input can be a same signal, and no limitation is made herein.

An exemplary specific structure of the input unit 1 in the shift register is illustrated above, but the input unit 1 is not limited to the above exemplary specific structure and can be other structures known to those skilled in the art when being implemented specifically, no limitation is made herein on the structure of the input unit 1.

Specifically, in the shift register according to the embodiments of the present disclosure, as shown in FIG. 5a and FIG. 5b, the reset unit 2 comprises a second switching transistor M2. A gate of the second switching transistor M2 is configured to receive the reset control signal Reset, a source of the second switching transistor M2 is configured to receive a second reference signal CNB, and a drain of the second switching transistor M2 is connected to the first node A.

Specifically, the second switching transistor M2 can be an N type transistor or can be a P type transistor, no limitation is made herein to the type of the second switching transistor M2.

In a specific implementation, as shown in FIG. 6a and FIG. 6b, the second reference signal CNB can be supplied from the reference signal terminal Vref, and no limitation is made herein.

An exemplary specific structure of the reset unit 2 in the shift register is illustrated above, but the reset unit 2 is not limited to the above exemplary specific structure and can be other structures known to those skilled in the art when being implemented specifically, no limitation is made herein on the structure of the reset unit 2.

Specifically, in the shift register according to the embodiments of the present disclosure, as shown in FIG. 5a and FIG. 5b, the pulling-up unit 4 comprises a third switching transistor M3 and a third capacitor C3. A gate of the third switching transistor M3 is connected to the first node A, a source of the third switching transistor M3 is configured to receive the first clock signal CK, and a drain of the third switching transistor M3 is connected to the driving signal output terminal Output. The third capacitor C3 is connected between the gate and the drain of the third switching transistor M3.

Specifically, the third switching transistor M3 can be an N type transistor as shown in FIG. 5a, or can be a P type transistor as shown in FIG. 5b. No limitation is made herein to the type of the third switching transistor M3.

An exemplary specific structure of the pulling-up unit 4 in the shift register is illustrated above, but the pulling-up unit 4 is not limited to the above exemplary specific structure and can be other structures known to those skilled in the art when being implemented specifically, no limitation is made herein on the structure of the pulling-up unit 4.

Specifically, in the shift register according to the embodiments of the present disclosure, as shown in FIG. 5a and FIG. 5b, the pulling-down unit 5 comprises a fourth switching transistor M4. A gate of the fourth switching transistor M4 is connected to the second node B, a source of the fourth switching transistor M4 is connected to the reference signal terminal Vref, and a drain of the fourth switching transistor M4 is connected to the driving signal output terminal Output.

Specifically, the fourth switching transistor M4 can be an N type transistor as shown in FIG. 5a, or can be a P type transistor as shown in FIG. 5b. No limitation is made herein to the type of the fourth switching transistor M4.

An exemplary specific structure of the pulling-down unit 5 in the shift register is illustrated above, but the pulling-down unit 5 is not limited to the above exemplary specific structure and can be other structures known to those skilled in the art when being implemented specifically, no limitation is made herein on the structure of the pulling-down unit 5.

Specifically, in the shift register according to the embodiments of the present disclosure, as shown in FIG. 5a and FIG. 5b, the discharging control unit 6 comprises a fifth switching transistor M5 and a sixth switching transistor M6. A gate and a source of the fifth switching transistor M5 and a gate of the sixth switching transistor M6 are configured to receive the discharging control signal EN1, and a drain of the fifth switching transistor M5 is connected to the driving signal output terminal Output. A source of the sixth switching transistor M6 is connected to the reference signal terminal Vref, and the drain of the sixth switching transistor M6 is connected to the second node B.

Specifically, the fifth switching transistor M5 and the sixth switching transistor M6 can be N type transistors as shown in FIG. 5a, or can be P type transistors as shown in FIG. 5b. No limitation is made herein to the types of the fifth switching transistor M5 and the sixth switching transistor M6.

An exemplary specific structure of the discharging control unit 6 in the shift register is illustrated above, but the discharging control unit 6 is not limited to the above exemplary specific structure and can be other structures known to those skilled in the art when being implemented specifically, no limitation is made herein on the structure of the discharging control unit 6.

Specifically, in the shift register according to the embodiments of the present disclosure, as shown in FIG. 5a and FIG. 5b, the driving control unit 3 comprises a seventh switching transistor M7, an eighth switching transistor M8, a ninth switching transistor M9 and a tenth switching transistor M10.

A gate and a source of the seventh switching transistor M7 are configured to receive a second clock signal CKB, and a drain of the seventh switching transistor M7 is connected to the second node B. The first clock signal CK and the second clock signal CKB are opposite to each other.

A gate of the eighth switching transistor M8 is connected to the second node B, a source of the eighth switching transistor M8 is connected to the reference signal terminal Vref, and a drain of the eighth switching transistor M8 is connected to the first node A.

A gate of the ninth switching transistor M9 is connected to the first node A, a source of the ninth switching transistor M9 is connected to the reference signal terminal Vref, and a drain of the ninth switching transistor M9 is connected to the second node B.

A gate of the tenth switching transistor M10 is connected to the driving signal output terminal Output, a source of the tenth switching transistor M10 is connected to the reference signal terminal Vref, and a drain of the tenth switching transistor M10 is connected to the second node B.

Specifically, the seventh switching transistor M7, the eighth switching transistor M8, the ninth switching transistor M9 and the tenth switching transistor M10 can be N type transistors as shown in FIG. 5a, or can be P type transistors as shown in FIG. 5b. No limitation is made herein to the types of the seventh to tenth switching transistors M7-M10.

An exemplary specific structure of the driving control unit 3 in the shift register is illustrated above, but the driving control unit 3 is not limited to the above exemplary specific structure and can be other structures known to those skilled in the art when being implemented specifically, no limitation is made herein on the structure of the driving control unit 3.

Preferably, in the shift register according to the embodiments of the present disclosure, the switching transistors are generally of a same type. In a specific implementation, all of the switching transistors are N type transistors when the active pulse signal of trigger signals is a high level signal, and are P type transistors when the active pulse signal of trigger signals is a low level signal.

It should be explained that the switching transistors in the embodiments of the present disclosure may be thin film transistors TFTs or may be metal oxide semiconductor field effect transistors MOSFET, no limitation is made herein on the types of the switching transistors. In a specific implementation, a source and a drain of a switching transistor may be exchangeable depending on type of the switching transistor and the input signal, and thus are not distinguished from each other herein.

Description will be given to operation of the shift register according to the embodiments of the present disclosure by taking the shift registers as shown in FIG. 6a and FIG. 6b as examples. Hereinafter, "1" represents a high level signal and "0" represents a low level signal.

Figure 7A:
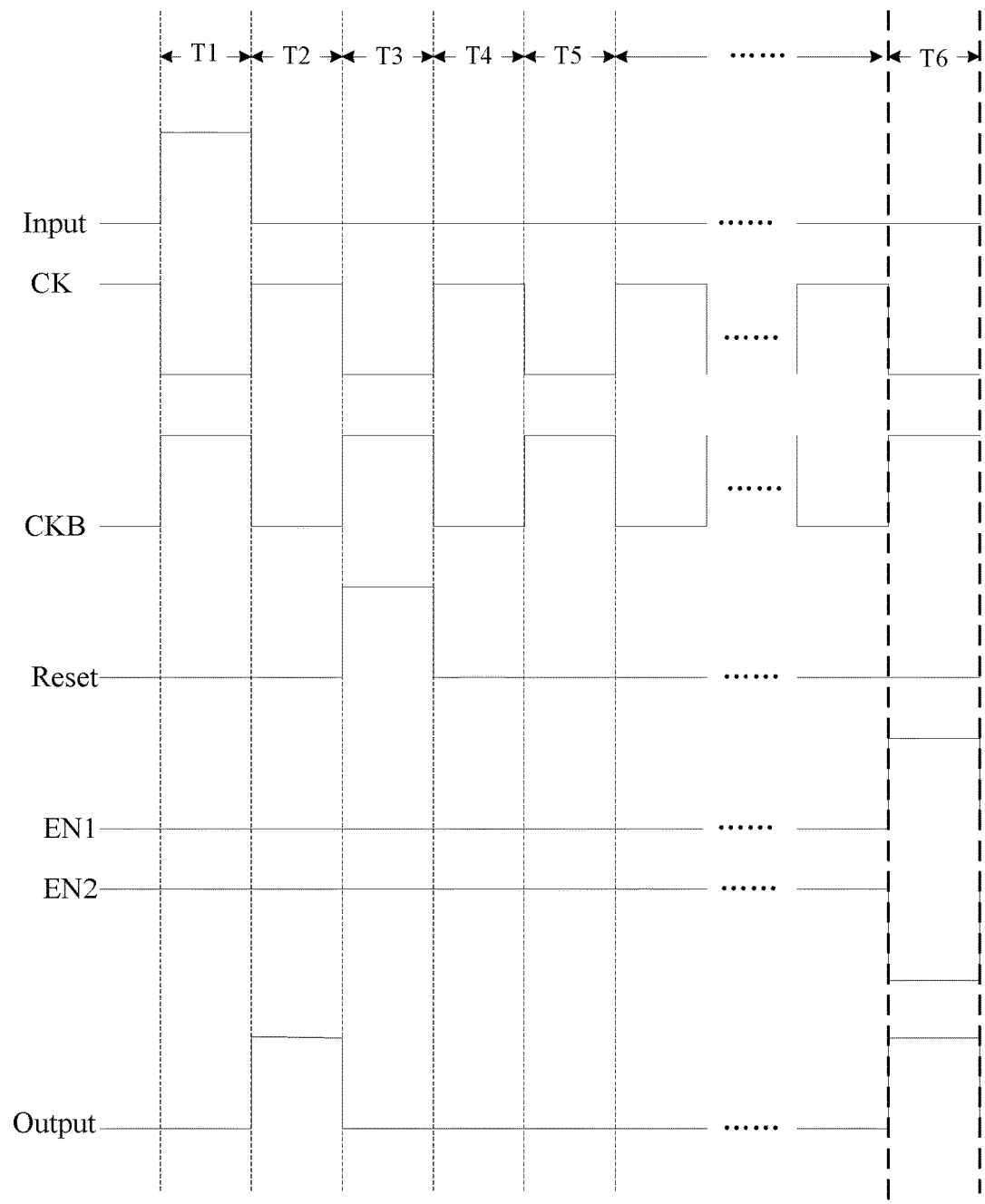

For the shift register as shown in FIG. 6a, all of the switching transistors in the shift register are N type transistors, and timing sequences of input and output signals of the shift register are as shown in FIG. 7a. Specifically, six periods T1~T6 in the timing sequences of input and output signals as shown in FIG. 7a will be discussed, where T1~T5 are periods for normal display, and T6 is the period during which the display screen is powered off.

During the period T1, Input=1, CK=0, CKB=1, Reset=0, EN1=0, EN2=1.

The first switching transistor M1 is turned on since Input=1, the first node A is at a high level, such that the third switching transistor M3 and the ninth switching transistor M9 are turned on. The seventh switching transistor M7 is turned on since CKB=1. The second node B is at a low level when the seventh switching transistor M7 and the ninth switching transistor M9 are both turned on. The driving signal output terminal Output outputs a low level signal since the third switching transistor M3 is turned on and CK=0.

During the period T2, Input=0, CK=1, CKB=0, Reset=0, EN1=0, EN2=1.

The level at the first node A is further pulled up since CK=1, and the third switching transistor M3 and the ninth switching transistor M9 are turned on. The second node B is at a low level since the ninth switching transistor M9 is turned on. The driving signal output terminal Output outputs a high level signal since the third switching transistor M3 is turned on and CK=1.

During the period T3, Input=0, CK=0, CKB=1, Reset=1, EN1=0, EN2=1.

The second switching transistor M2 is turned on since Reset=1, such that the first node A is at a low level. The seventh switching transistor M7 is turned on since CKB=1, such that the second node B is at a high level and the fourth switching transistor M4 and the eighth switching transistor M8 are turned on. The first node A is further ensured to be at a low level since the eighth switching transistor M8 is turned on. The driving signal output terminal Output outputs a low level signal since the fourth switching transistor M4 is turned on.

During the period T4, Input=0, CK=1, CKB=0, Reset=0, EN1=0, EN2=1.

The first node A and the second node B are initially both at a floating state, the second node B keeps its high level due to the voltage holding effect of the second capacitor C2, the eighth switching transistor M8 is turned on, such that the first node A is at a low level, the fourth switching transistor M4 is turned on, and thus the driving signal output terminal Output outputs a low level signal.

During the period T5, Input=0, CK=0, CKB=1, Reset=0, EN1=0, EN2=1.

The seventh switching transistor M7 is turned on since CKB=1, such that the second node B is at a high level and thus the fourth switching transistor M4 and the eighth switching transistor M8 are turned on. The first node A is at a low level since the eighth switching transistor M8 is turned on. The driving signal output terminal Output outputs a low level signal since the fourth switching transistor M4 is turned on.

During the period T6, Input=0, CK=0, CKB=1, Reset=0, EN1=1, EN2=0.

The fifth switching transistor M5 and the sixth switching transistor M6 are turned on since EN1=1. The discharging control signal EN1 is supplied to the driving signal output terminal Output through the fifth switching transistor M5 which is turned on, and a low level signal at the reference signal terminal Vref is supplied to the second node B through the sixth transistor M6 which is turned on. During this period, the first node A is in a floating state, if the first capacitor C1 is not incorporated, the first node A may not be fully at a low level due to leakage current flowing through the thin film switching transistors, such that the third switching transistor M3 is turned on, as a result, the first clock signal being at a low level is supplied to the driving signal output terminal Output through the third switching transistor M3 being turned on, such that the driving signal output terminal Output cannot be fully pulled up, rendering that the thin film transistors connected to the gate line corresponding to the shift register cannot be turned on and the charges accumulated in the display screen cannot be released rapidly.

However, since the first control signal EN2 received by the first capacitor C1 and the second control signal EN3 received by the second capacitor C2 are both at a low level, it can be ensured that the first node A is fully pulled down by aid of voltage coupling effect of the first capacitor C1, such that the third switching transistor M3 is turned off; and it can be ensured that the second node B is fully pulled down by aid of voltage coupling effect of the second capacitor C2, such that the fourth switching transistor M4 is turned off. As a result, it can be ensured that the driving signal output terminal Output is pulled up, the thin film transistors connected to the gate line corresponding to the shift register are turned on, and thus the charges accumulated in the display screen can be released rapidly.

It should be explained that during display time of a frame of image, each of the shift registers performs the periods T1-T5 first and then repeats the periods T4 and T5 until a next frame of image comes.

Figure 7B:
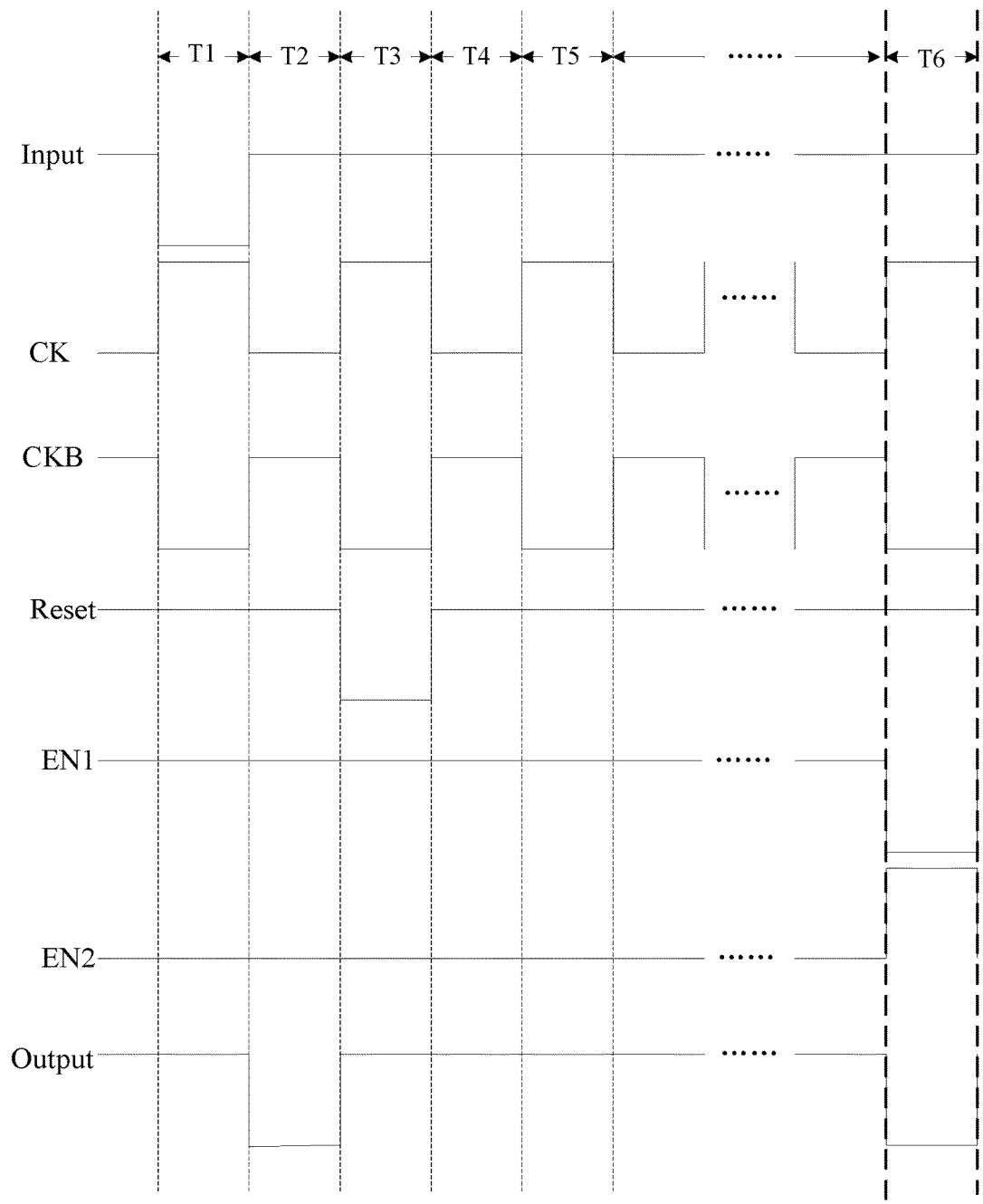
FIG. 7b is a schematic diagram of timing sequences of signals of the shift register shown in FIG. 6b.

For the shift register as shown in FIG. 6b, all of the switching transistors in the shift register are P type transistors, and timing sequences of input and output signals of the shift register are as shown in FIG. 7b. Specifically, six periods T1~T6 in the timing sequences of input and output signals as shown in FIG. 7b will be discussed, where T1~T5 are periods for normal display, and T6 is the period during which the display screen is powered off. The reference signal terminal Vref is at a high level.

During the period T1, Input=0, CK=1, CKB=0, Reset=1, EN1=1, EN2=0.

The first switching transistor M1 is turned on since Input=0, the first node A is at a low level, such that the third switching transistor M3 and the ninth switching transistor M9 are turned on. The seventh switching transistor M7 is turned on since CKB=0. The second node B is at a high level when the seventh switching transistor M7 and the ninth switching transistor M9 are both turned on. The driving signal output terminal Output outputs a high level signal since the third switching transistor M3 is turned on and CK=1.

During the period T2, Input=1, CK=0, CKB=1, Reset=1, EN1=1, EN2=0.

The level at the first node A is further pulled down since CK=0, and the third switching transistor M3 and the ninth switching transistor M9 are turned on. The second node B is at a high level since the ninth switching transistor M9 is turned on. The driving signal output terminal Output outputs a low level signal since the third switching transistor M3 is turned on and CK=0.

During the period T3, Input=1, CK=1, CKB=0, Reset=0, EN1=1, EN2=0.

The second switching transistor M2 is turned on since Reset=0, such that the first node A is at a high level. The seventh switching transistor M7 is turned on since CKB=0, such that the second node B is at a low level and the fourth switching transistor M4 and the eighth switching transistor M8 are turned on. The first node A is further ensured to be at a high level since the eighth switching transistor M8 is turned on. The driving signal output terminal Output outputs a high level signal since the fourth switching transistor M4 is turned on.

During the period T4, Input=1, CK=0, CKB=1, Reset=1, EN1=1, EN2=0.

The first node A and the second node B are initially both at a floating state, the second node B keeps its low level due to the voltage holding effect of the second capacitor C2, the eighth switching transistor M8 is turned on, such that the first node A is at a high level, the fourth switching transistor M4 is turned on, and thus the driving signal output terminal Output outputs a high level signal.

During the period T5, Input=1, CK=1, CKB=0, Reset=1, EN1=1, EN2=0.

The seventh switching transistor M7 is turned on since CKB=0, such that the second node B is at a low level and thus the fourth switching transistor M4 and the eighth switching transistor M8 are turned on. The first node A is at a high level since the eighth switching transistor M8 is turned on. The driving signal output terminal Output outputs a high level signal since the fourth switching transistor M4 is turned on.

During the period T6, Input=1, CK=1, CKB=0, Reset=1, EN1=0, EN2=1.

The fifth switching transistor M5 and the sixth switching transistor M6 are turned on since EN1=0. The discharging control signal EN1 is supplied to the driving signal output terminal Output through the fifth switching transistor M5 which is turned on, and a high level signal at the reference signal terminal Vref is supplied to the second node B through the sixth transistor M6 which is turned on. During this period, the first node A is in a floating state, if the first capacitor C1 is not incorporated, the first node A may not be fully at a high level due to leakage current flowing through the thin film switching transistors, such that the third switching transistor M3 is turned on, as a result, the first clock signal being at a high level is supplied to the driving signal output terminal Output through the third switching transistor M3 being turned on, such that the driving signal output terminal Output cannot be fully pulled down, rendering that the thin film transistors connected to the gate line corresponding to the shift register cannot be turned on and the charges accumulated in the display screen cannot be released rapidly. However, since the first control signal EN2 received by the first capacitor C1 and the second control signal EN3 received by the second capacitor C2 are both at a high level, it can be ensured that the first node A is fully pulled up by aid of voltage coupling effect of the first capacitor C1, such that the third switching transistor M3 is turned off; and it can be ensured that the second node B is fully pulled up by aid of voltage coupling effect of the second capacitor C2, such that the fourth switching transistor M4 is turned off. As a result, it can be ensured that the driving signal output terminal Output is pulled down, the thin film transistors connected to the gate line corresponding to the shift register are turned on, and thus the charges accumulated in the display screen can be released rapidly.

It should be explained that during display time of a frame of image, each of the shift registers performs the periods T1-T5 first and then repeats the periods T4 and T5 until a next frame of image comes.

According to another aspect of the present disclosure, based on a same inventive concept, there is provided a gate driving circuit comprising a plurality of cascaded shift registers according to any of the above embodiments of the present disclosure. Since the operational principle of the gate driving circuit for solving the problem discussed above is similar as that of the shift register, specific implementations of the gate driving circuit can be obtained with reference to the specific implementations of the shift registers, and descriptions for the gate driving circuit which are similar to those for the shift registers will not be repeated herein.

In a specific implementation, in the gate driving circuit according to one embodiment of the present disclosure, one shift register corresponds to a first node control unit, and/or one shift register corresponds to a second node control unit.

That is, in the gate driving circuit, each of the shift registers comprises a first node control unit, or each of the shift registers comprises a second node control unit, or each of the shift registers comprises a first node control unit and a second node control unit.

Figure 9A:
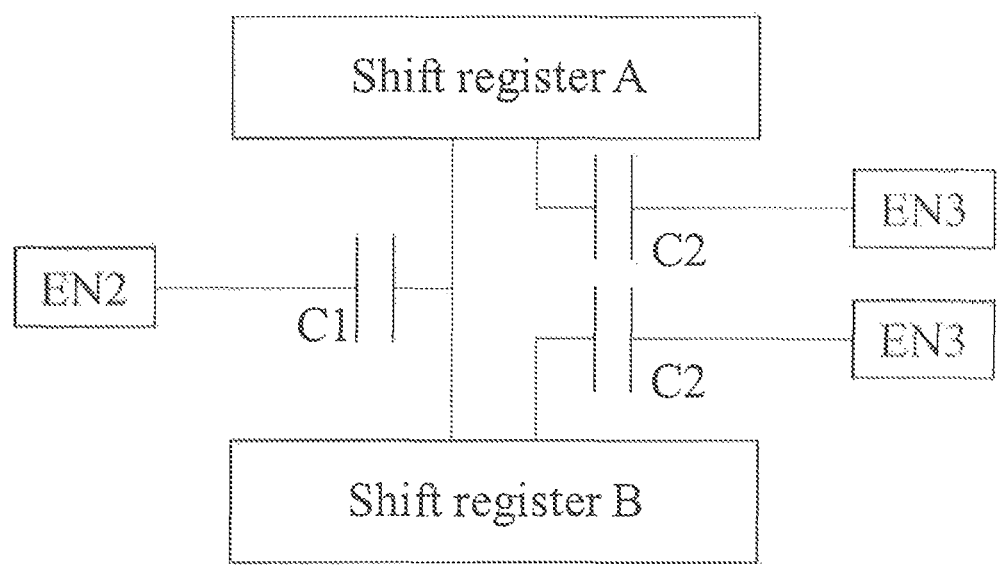
FIG. 9A is a schematic diagram of at least two shift registers sharing a first node control unit.
Figure 9B:
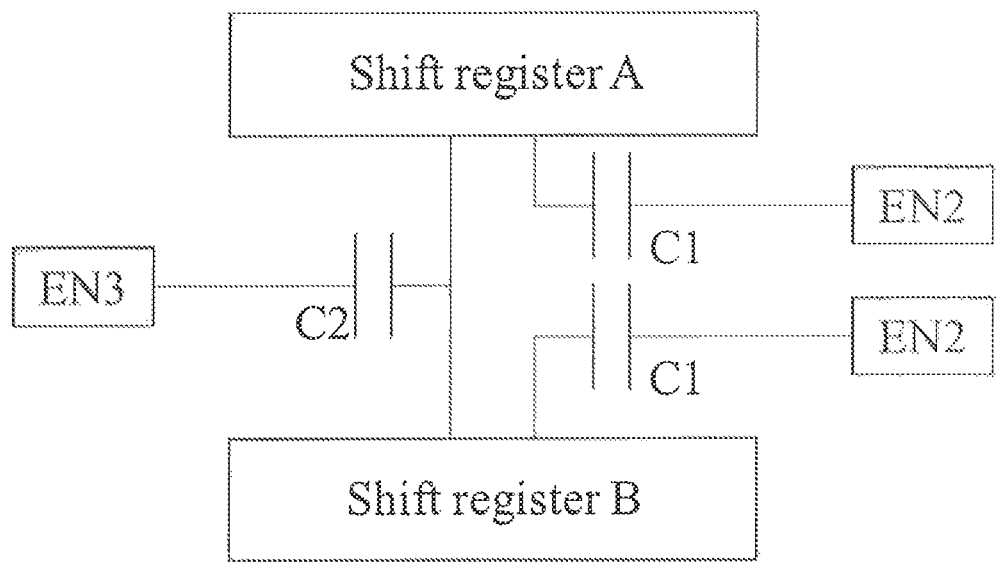
FIG. 9B is a schematic diagram of at least two shift registers sharing a second node control unit.

Alternatively, in a specific implementation, in the gate driving circuit according to one embodiment of the present disclosure, at least two shift registers correspond to a first node control unit, that is, at least two shift registers share a first node control unit, as shown in FIG. 9A; and/or at least two shift registers correspond to a second node control unit, that is, at least two shift registers share a second node control unit, as shown in FIG. 9B.

Figure 10:
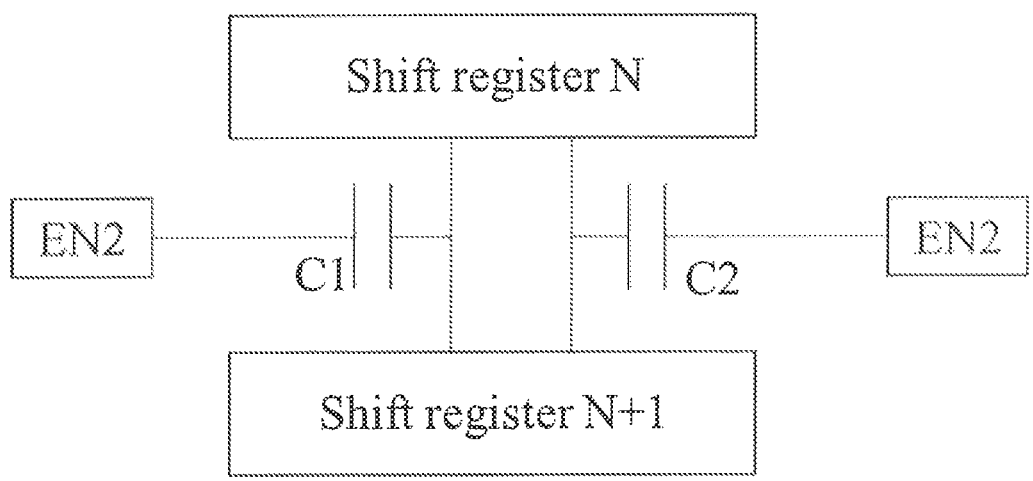
FIG. 10 is a schematic diagram of two adjacent shift registers.

Preferably, in the gate driving circuit according to one embodiment of the present disclosure, at least two adjacent shift registers share a first node control unit, and/or at least two adjacent shift registers share a second node control unit, as shown in FIG. 10.

According to another aspect of the present disclosure, based on a same inventive concept, there is provided a display screen comprising the gate driving circuit according to the above embodiments of the present disclosure. The display screen may be a display screen of any product or means possessing display function, such as a mobile phone, a pad computer, a television, a display, a notebook computer, a digital photo frame, a navigator and the like. Specific implementations of the display screen can be obtained with reference to those of the gate driving circuit discussed above, and descriptions for the display screen which are similar to those for the gate driving circuit will not be repeated herein.

According to another aspect of the present disclosure, based on a same inventive concept, there is provided a method for driving the display screen. During the period that the display screen is powered off, each of the first node control units controls the level at the first node in the shift register corresponding thereto according to the first control signal so as to put the pulling-up unit in the shift register corresponding thereto in an OFF state; and/or each of the second node control units controls the level at the second node in the shift register corresponding thereto according to the second control signal so as to put the pulling-down unit in the shift register corresponding thereto in an OFF state.

It should be explained that the period that the display screen is powered off refers to a period from the timing at which the power cut for the display screen is beginning to the timing at which the power cut for the display screen is fully completed.

In the shift register, the driving control circuit, the display screen and the method for driving the display screen according to the embodiments of the present disclosure, the first node control unit and/or the second node control unit are further incorporated on the basis of the shift register in the prior art which comprises the input unit, the reset unit, the driving control unit, the pulling-up unit, the pulling-down unit and the discharging control unit, where an input terminal of the first node control unit is configured to receive a first control signal, and an output terminal of the first node control unit is connected to the first node of the shift register, the first node control unit is configured to control a level at the first node according to the first control signal so as to put the pulling-up unit in an OFF state; an input terminal of the second node control unit is configured to receive a second control signal, and an output terminal of the second node control unit is connected to the second node of the shift register, the second node control unit is configured to control a level at the second node according to the second control signal so as to put the pulling-down unit in an OFF state. As a result, during the period that the display screen is powered off, the level at the driving signal output terminal is prevented from being affected by the pulling-up unit through the first node control unit and from being affected by the pulling-down unit through the second node control unit, such that it can be ensured that the thin film transistors connected to the gate line corresponding to the shift register are all turned on and thus the charges accumulated in the display screen can be released rapidly.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A shift register comprising an input unit, a reset unit, a driving control unit, a pulling-up unit, a pulling-down unit and a discharging control unit,
   wherein an output terminal of the input unit, an output terminal of the reset unit, a first terminal of the driving control unit and a control terminal of the pulling-up unit are connected to a first node; a second terminal of the driving control unit, a control terminal of the pulling-down unit and a first output terminal of the discharging control unit are connected to a second node; and an output terminal of the pulling-up unit, an output terminal of the pulling-down unit and a second output terminal of the discharging control unit are connected to a driving signal output terminal of the shift register,
   characterized in that the shift register further comprises: a first node control unit and/or a second node control unit,
   wherein an input terminal of the first node control unit is configured to receive a first control signal, an output terminal of the first node control unit is connected to the first node of the shift register, and the first node control unit is configured to control a level at the first node according to the first control signal so as to put the pulling-up unit in an OFF state;
   an input terminal of the second node control unit is configured to receive a second control signal, an output terminal of the second node control unit is connected to the second node of the shift register, and the second node control unit is configured to control a level at the second node according to the second control signal so as to put the pulling-down unit in an OFF state.

2. The shift register of claim 1, wherein the first node control unit comprises a first capacitor,
   wherein a first electrode of the first capacitor is connected to the first node and a second electrode of the first capacitor is configured to receive the first control signal.

3. The shift register of claim 1, wherein the second node control unit comprises a second capacitor,
   wherein a first electrode of the second capacitor is connected to the second node and a second electrode of the second capacitor is configured to receive the second control signal.

4. The shift register of claim 1, wherein the shift register comprises the first node control unit and the second node control unit, the first control signal and the second control signal are a same control signal, wherein the first node control unit comprises a first capacitor, wherein a first electrode of the first capacitor is connected to the first node and a second electrode of the first capacitor is configured to receive the first control signal, wherein the second node control unit comprises a second capacitor, wherein a first electrode of the second capacitor is connected to the second node and a second electrode of the second capacitor is configured to receive the second control signal.

5. The shift register of claim 4, wherein the second electrode of the first capacitor and the second electrode of the second capacitor are arranged in a same layer, and/or the first electrode of the first capacitor and the first electrode of the second capacitor are arranged in a same layer.

6. The shift register of claim 4, wherein the first capacitor and the second capacitor have a same capacitance value.

7. A gate driving circuit comprising a plurality of cascaded shift registers of claim 1.

8. The gate driving circuit of claim 7, wherein each of the shift registers corresponds to the first node control unit one by one, and/or each of the shift registers corresponds to the second node control unit one by one.

9. The gate driving circuit of claim 7, wherein at least two shift registers share the first node control unit, and/or at least two shift registers share the second node control unit.

10. The gate driving circuit of claim 7, wherein when the shift register comprises the first node control unit and the second node control unit, the first control signal and the second control signal are a same control signal, at least two adjacent shift registers share the first node control unit, and at least two adjacent shift registers share the second node control unit.

11. A method for driving a display screen comprising the gate driving circuit of claim 7, comprising: during the period that the display screen is powered off, each of the first node control units controls the level at the first node in the shift register corresponding thereto according to the first control signal so as to put the pulling-up unit in the shift register corresponding thereto in an OFF state; and/or each of the second node control units controls the level at the second node in the shift register corresponding thereto according to the second control signal so as to put the pulling-down unit in the shift register corresponding thereto in an OFF state.

12. The method of claim 11, wherein the shift register comprises the first node control unit and the second node control unit, the first control signal and the second control signal are a same control signal, the first node control unit comprises a first capacitor, wherein a first electrode of the first capacitor is connected to the first node and a second electrode of the first capacitor is configured to receive the first control signal;

the second node control unit comprises a second capacitor, wherein a first electrode of the second capacitor is connected to the second node and a second electrode of the second capacitor is configured to receive the second control signal.

* * * * *